(12) United States Patent
Zeng et al.

(10) Patent No.: US 10,720,222 B2
(45) Date of Patent: Jul. 21, 2020

(54) SOLID STATE STORAGE DEVICE USING STATE PREDICTION METHOD

(71) Applicants: Lite-On Electronics (Guangzhou) Limited, Guangzhou (CN); LITE-ON TECHNOLOGY CORPORATION, Taipei (TW)

(72) Inventors: Shih-Jia Zeng, Taipei (TW); Jen-Chien Fu, Taipei (TW); Tsu-Han Lu, Taipei (TW); Hsiao-Chang Yen, Taipei (TW)

(73) Assignee: SOLID STATE STORAGE TECHNOLOGY CORPORATION, Taipei (TW)

( * ) Notice: Subject to any disclaimer, the term of this patent is extended or adjusted under 35 U.S.C. 154(b) by 145 days.

(21) Appl. No.: 16/157,177

(22) Filed: Oct. 11, 2018

(65) Prior Publication Data

US 2020/0065174 A1 Feb. 27, 2020

(30) Foreign Application Priority Data

Aug. 21, 2018 (CN) .......................... 2018 1 0954669

(51) Int. Cl.
*G11C 16/34* (2006.01)
*G06F 3/06* (2006.01)
*G06F 11/14* (2006.01)
*G11C 29/00* (2006.01)

(52) U.S. Cl.
CPC ........ *G11C 16/3404* (2013.01); *G06F 3/0611* (2013.01); *G06F 11/141* (2013.01); *G11C 29/84* (2013.01)

(58) Field of Classification Search
CPC .. G06F 11/14; G06F 11/1402; G06F 11/1405; G06F 11/141; G06F 3/0611; G06F 3/0614; G06F 3/0619; G06F 2212/7206; G11C 16/34; G11C 16/3404; G11C 16/3418; G11C 16/3422; G11C 29/021; G11C 29/028; G11C 29/04; G11C 29/70; G11C 29/78; G11C 29/84; G11C 29/50004; G11C 2207/2254

See application file for complete search history.

(56) References Cited

U.S. PATENT DOCUMENTS

| | | | |
|---|---|---|---|
| 9,922,706 B2 | 3/2018 | Zeng et al. | |
| 10,379,739 B1* | 8/2019 | Bazarsky | G11C 11/56 |
| 2012/0236656 A1* | 9/2012 | Cometti | G11C 16/26 365/185.22 |
| 2017/0206979 A1* | 7/2017 | Cohen | G11C 16/3427 |
| 2019/0004734 A1* | 1/2019 | Kirshenbaum | G06F 3/0659 |
| 2019/0187189 A1* | 6/2019 | Jeter | G11C 5/02 |
| 2019/0340060 A1* | 11/2019 | Nijhawan | G06F 11/0727 |

* cited by examiner

*Primary Examiner* — Gabriel Chu
(74) *Attorney, Agent, or Firm* — WPAT, PC

(57) ABSTRACT

A solid state storage device includes a non-volatile memory and a control circuit. The non-volatile memory includes a specified region. The control circuit is connected with the non-volatile memory, and includes a function storage circuit. A state prediction function for a first failure mode and a state prediction function for a second failure mode are stored in the function storage circuit. If the control circuit confirms that the specified region is changed from the first failure mode to the second failure mode, the control circuit predicts the specified region according to current state parameters of the specified region and the state prediction function for the second failure mode.

7 Claims, 4 Drawing Sheets

| | Failure mode (Fn) | Error bit number (Eb) | Read voltage shift (Vrb) | Retry rate (Rr) | Error bit number after R days (Eb') | Read voltage shift after R days (Vrb') | Retry rate after R days (Rr') |
|---|---|---|---|---|---|---|---|
| Block_1 | X | 25 | -5 | 0% | 33 | -2 | 10% |
| Block_2 | X | 74 | +3 | 0% | 80 | +7 | 15% |
| Block_3 | F1 | 132 | -5 | 20% | 205 | -6 | 20% |
| Block_4 | F2 | 125 | -12 | 45% | 189 | -10 | 50% |
| ⋮ | | | | | | | |
| Block_N-1 | F4 | 254 | +14 | 65% | 350 | +16 | 65% |
| Block_N | F3 | 186 | -11 | 70% | 302 | -8 | 70% |

| | Program time (Pt) | Erase time (Et) | Error bit number (Eb) | Real-time read voltage shift (Vrb) | Real-time decoding process (Dp) | 2-month read voltage shift (Vrb') | 2-month decoding process (Dp') |
|---|---|---|---|---|---|---|---|
| Block_1 | 1894 | 5615 | 55 | -3 | A | -5 | A |
| Block_2 | 1725 | 6441 | 76 | -5 | A | -9 | B |
| Block_3 | 2034 | 6342 | 102 | -8 | B | -12 | C |
| Block_4 | 2188 | 5983 | 153 | -10 | C | -15 | Fail |
| ... | | | | | | | |
| Block_N-1 | 1649 | 7212 | 203 | +15 | C | +2 | C |
| Block_N | 1523 | 7420 | 188 | -13 | C | -19 | Fail |

FIG. 3 (PRIOR ART)

| | Failure mode (Fn) | Error bit number (Eb) | Read voltage shift (Vrb) | Retry rate (Rr) | Error bit number after R days (Eb') | Read voltage shift after R days (Vrb') | Retry rate after R days (Rr') |
|---|---|---|---|---|---|---|---|
| Block_1 | X | 25 | -5 | 0% | 33 | -2 | 10% |
| Block_2 | X | 74 | +3 | 0% | 80 | +7 | 15% |
| Block_3 | F1 | 132 | -5 | 20% | 205 | -6 | 20% |
| Block_4 | F2 | 125 | -12 | 45% | 189 | -10 | 50% |
| ... | | | | | | | |
| Block_N-1 | F4 | 254 | +14 | 65% | 350 | +16 | 65% |
| Block_N | F3 | 186 | -11 | 70% | 302 | -8 | 70% |

FIG. 4

SOLID STATE STORAGE DEVICE USING STATE PREDICTION METHOD

This application claims the benefit of People's Republic of China Patent Application No. 201810954669.2, filed Aug. 21, 2018, the subject matter of which is incorporated herein by reference.

FIELD OF THE INVENTION

The present invention relates to a solid state storage device, and more particularly to a solid state storage device using a state prediction method.

BACKGROUND OF THE INVENTION

As is well known, solid state storage devices such as SD cards or solid state drives (SSD) are widely used in various electronic devices. Generally, a solid state storage device comprises a non-volatile memory. After data are written to the non-volatile memory, if no electric power is supplied to the solid state storage device, the data are still retained in the non-volatile memory.

U.S. Pat. No. 9,922,706 discloses a solid state storage device using a state prediction method. The state prediction method uses a prediction function to predict the state of the solid state storage device in the future time, predict the suitable decoding process or provide the suitable read voltage.

FIG. 1 is a schematic functional block diagram illustrating the architecture of a conventional solid state storage device. As shown in FIG. 1, the solid state storage device 10 is connected with a host 14 through an external bus 12. For example, the external bus 12 is a USB bus, a SATA bus, a PCIe bus, a M.2 bus, a U.2 bus, or the like.

The solid state storage device 10 comprises a control circuit 101 and a non-volatile memory 105. The control circuit 101 is connected with the non-volatile memory 105 through an internal bus 107. According to a command from the host 14, the control circuit 101 stores the received write data into the non-volatile memory 105, or the control circuit 101 acquires a read data from the non-volatile memory 105 and transmits the read data to the host 14.

The control circuit 101 further comprises an error correction code (ECC) circuit 104 and a function storage circuit 106. The ECC unit 104 is used for correcting the error bits of the read data. After the error bits of the read data are corrected, accurate read data are transmitted to the host 14. Moreover, plural prediction functions are stored in the function storage circuit 106.

After the solid state storage device 10 leaves the factory, if the solid state storage device 10 has been programmed and erased many times, the threshold voltage distribution curves of the storing state of the memory cells in the non-volatile memory 105 are possibly shifted. Under this circumstance, a read failure problem occurs.

When the non-volatile memory 105 is in a failure mode, the read failure problem occurs. For example, the failure mode includes a cycling mode, a high/room temperature baking mode, a read disturb mode, a cross-temperature read/write mode, a program disturb mode, a data retention mode, and the like. In the failure mode, the control circuit 101 cannot accurately acquire the read data. Then, the control circuit 101 performs a read retry process.

FIG. 2 schematically illustrates a flowchart of a read retry method for the conventional solid state storage device. During the read cycle, the control circuit 101 performs a decoding process A. In the decoding process A, a hard decoding operation is performed according to a default voltage set. That is, the control circuit 101 provides the default voltage set to the non-volatile memory 105, and the ECC circuit 104 performs the hard decoding operation to correct the read data.

If the error bits of the read data can be corrected, it means that the decoding process A passes and the decoding operation is successfully done. Consequently, the accurate read data is transmitted from the control circuit 101 to the host 14. Whereas, if the error bits of the read data cannot be corrected, the read data is not accurately acquired and the decoding process A fails. Then, the control circuit 101 performs the read retry process.

After the control circuit 101 enters the read retry process, a decoding process B is firstly performed. In the decoding process B, a hard decoding operation is performed according to a retry voltage set. For example, the control circuit 101 provides one of plural retry voltage sets to the non-volatile memory 105 to acquire the read data. Then, the ECC circuit 104 performs the hard decoding operation to correct the read data. If the error bits of the read data can be corrected, it means that the decoding operation is successfully done to pass the decoding process B. Consequently, the accurate read data is transmitted from the control circuit 101 to the host 14. Whereas, if the error bits of the read data cannot be corrected, the read data is not accurately acquired and the decoding process B fails. Then, the control circuit 101 continuously provides another one of the plural retry voltage sets to the non-volatile memory 105 and performs the decoding process B.

If the decoding operation is successfully done according to one of the plural retry voltage sets, it means that the decoding process B passes. Whereas, if the data cannot be successfully decoded according to the entire of the retry voltage sets, it means that the decoding process B fails. Then, the control circuit 101 performs a decoding process C. Obviously, the time period of performing the decoding process B is longer than the time period of performing the decoding process A.

In the decoding process C, a soft decoding operation is performed according to the retry voltage sets. Generally, the soft decoding operation has better error correction capability than the hard decoding operation. However, the time period of performing the soft decoding operation is longer. That is, the time period of performing the decoding process C is longer than the time period of performing the decoding process B.

Similarly, if the decoding operation is successfully done by the control circuit 101 according to one of the plural retry voltage sets, it means that the decoding process C passes. Consequently, the accurate read data is transmitted from the control circuit 101 to the host 14. Whereas, if the data cannot be successfully decoded according to the entire of the retry voltage sets, it means that the decoding process C fails. Under this circumstance, the control circuit 101 confirms that the read data cannot be accurately acquired, and the control circuit 101 generates a failed message to the host 14 to indicate that the decoding process fails.

As mentioned above, if the solid state storage device 10 is in the failure mode, the decoding process A fails and the control circuit 101 enters the read retry process. In the read retry process, the control circuit 101 has to perform the decoding process B at first. If the control circuit 101 confirms that the decoding process B fails, the control circuit 101 performs the decoding process C. If the control circuit 101 confirms that the decoding process C fails, the control circuit 101 issues the failed message to the host 14 and is unable to provide the accurate read data.

If the time period of performing the read retry process is very long, the read speed of the solid state storage device 10 is largely decreased. To solve the problem mentioned above, the manufacturer of the solid state storage device 10 collects plural state parameters of all blocks in the non-volatile memory 105 before the solid state storage device 10 leaves the factory. Moreover, the state parameters are contained in an information table of the non-volatile memory 105 as a database.

FIG. 3 illustrates an information table of the non-volatile memory according to the prior art. In FIG. 3, the state parameters contain the program time (Pt), the erase time (Et), the error bit number (Eb), the real-time read voltage shift (Vrb) and the real-time decoding process (Dp).

For example, the state parameters of the first block (Block_1) indicates that the program time is 1894 μs, the erase time is 5615 μs, the error bit number is 55, the real-time read voltage shift Vrb is −3 and the decoding process A is the suitable decoding process. If the read voltage shift Vrb is −3, the real-time read voltage shift Vrb is 3 voltage units smaller than the default read voltage. The voltage unit is defined by the manufacture of the non-volatile memory. If the voltage unit is 10 mV, Vrb is −3 indicates that the real-time read voltage shift Vrb is 30 mV smaller than the default read voltage.

After the information table is established, the manufacturer of the solid state storage device 10 acquires plural prediction functions and stores the prediction functions in the function storage circuit 106. After the state parameters corresponding to a specified block are inputted into the prediction function, the state of the specified block in a future time (e.g., after 2 months) is predicted. For example, the read voltage shift condition after 2 months or the suitable decoding process after 2 months is predicted.

For example, after the state parameters of the specified block are substituted into the future decoding process prediction function, the control circuit 101 may predict that the decoding process B or the decoding process C will be the suitable decoding process in 2 months. Under this circumstance, the control circuit 101 tags the specified block. When the host 14 intends to read the data from the specified block, the control circuit 101 acquires the read data according to the predicted decoding process (i.e., the decoding process B or the decoding process C).

Alternatively, the control circuit 101 may predict that the decoding process for the specified block will fail in 2 months. For preventing the read failure condition, the control circuit 101 can previously store the data of the specified block in another block of the non-volatile memory 105. Since the time period of performing the read retry process is reduced, the read speed of the solid state storage device 10 is increased.

However, the prediction result of the prediction function is not always accurate. If the control circuit 101 predicts that the condition of the specified block will be good in 2 months after the plural state parameters are inputted into the prediction function, the decoding process A passes and the decoding operation is successfully done. Under this circumstance, the control circuit 101 does not perform any operation to the data of the specified block.

If the host 14 continuously reads the data of the specified block, the specified block is possibly suffered from the read disturb failure mode in the short time period. Consequently, the data of the specified block will not be successfully decoded by decoding process A in 2 months. Meanwhile, it is necessary to perform the decoding process B or the decoding process C for successfully decoding the data or, what is worse, the decoding processes B and C are failed. Since the prediction result is erroneous, the read speed of the solid state storage device 10 is decreased or the data is unable to be accurately read.

SUMMARY OF THE INVENTION

An embodiment of the present invention provides a solid state storage device. The solid state storage device includes a non-volatile memory and a control circuit. The non-volatile memory includes a specified region. The control circuit is connected with the non-volatile memory, and includes a function storage circuit. A state prediction function for a first failure mode and a state prediction function for a second failure mode are stored in the function storage circuit. If the control circuit confirms that the specified region is changed from the first failure mode to the second failure mode, the control circuit predicts the specified region according to current state parameters of the specified region and the state prediction function for the second failure mode.

Another embodiment of the present invention provides a state prediction method for the solid state storage device. Firstly, state parameters of the specified region are collected and stored as the current state parameters at a specified time interval. Then, the solid state storage device judges whether the specified region is changed from the first failure mode to the second failure mode. If the specified region is changed from the first failure mode to the second failure mode, predicting the specified region according to the current state parameters of the specified region and the state prediction function for the second failure mode.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 3 (prior art) illustrates an information table of the non-volatile memory according to the prior art;

FIG. 4 illustrates an example of an information table according to an embodiment of the present invention.

DETAILED DESCRIPTION OF PREFERRED EMBODIMENTS

Figure 1:
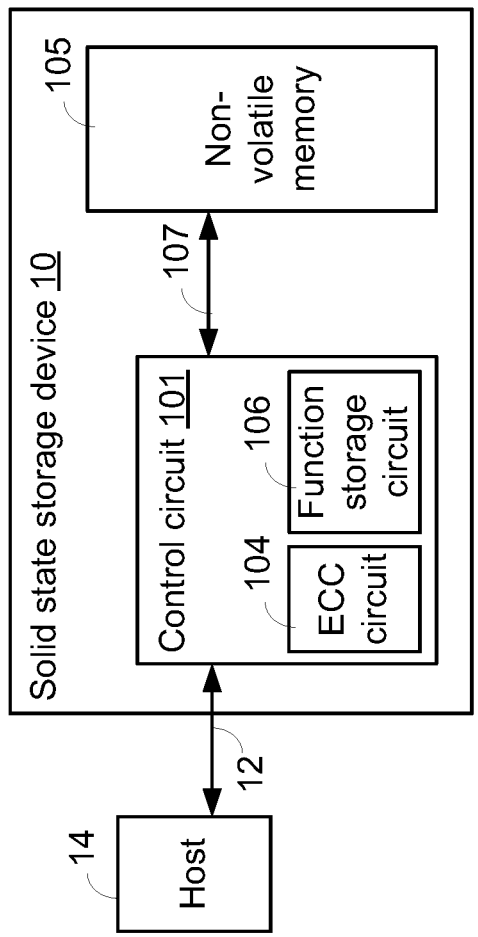
FIG. 1 (prior art) is a schematic functional block diagram illustrating the architecture of a conventional solid state storage device.
Figure 2:
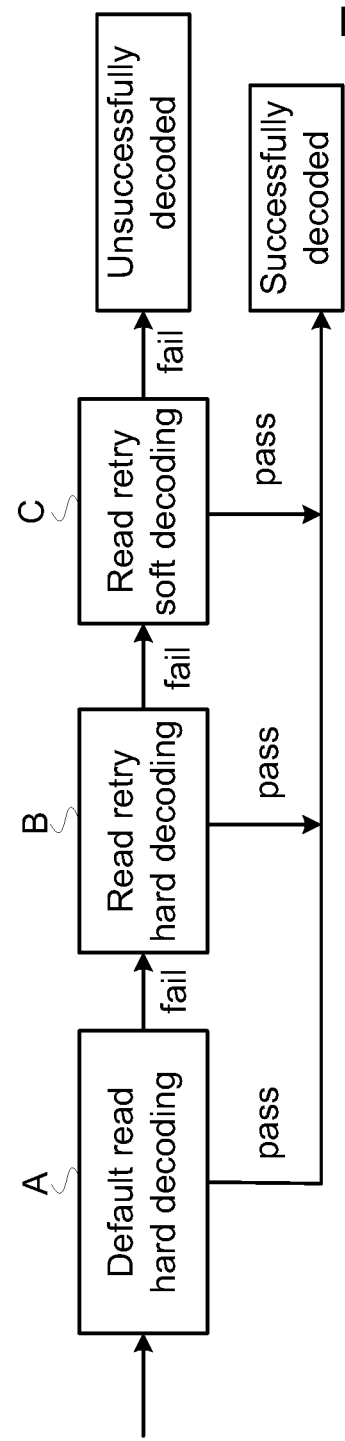
FIG. 2 (prior art) schematically illustrates a flowchart of a read retry method for the conventional solid state storage device.

Generally, the solid state storage device in different failure modes generates different prediction results. The present invention provides a solid state storage device using a state prediction method. According to different failure modes, a machine learning algorithm obtains a failure mode prediction function and the state prediction functions for the corresponding failure modes from an information table. These prediction functions are stored in the function storage circuit 106 of the control circuit 101 as shown in FIG. 1. Since the control circuit 101 is capable of dynamically updating the prediction result of the non-volatile memory 105, the read failure problem of the solid state storage device 10 is solved and the read speed of the solid state storage device 10 is increased.

FIG. 4 illustrates an example of an information table according to an embodiment of the present invention. The state parameters of the information table contain the failure mode (Fn), the error bit number (Eb), the read voltage shift (Vrb), the retry rate (Rr), the error bit number after R days (Eb'), the read voltage shift after R days (Vrb') and the retry rate after R days (Rr'). In some other embodiments, the state parameters further contain the program count, the erase count, the temperature, the read count, the histogram parameter, and the like.

Before the solid state storage device 10 leaves the factory, the manufacturer of the solid state storage device 10 collects the state parameters of N blocks in the non-volatile memory 105. Generally, as the block number N increases, the accuracy of the prediction result increases. In an embodiment, the plural state parameters of at least several ten thousands of blocks are collected. After the information table of the non-volatile memory 105 is established, the machine learning algorithm obtains the failure mode prediction function and the state prediction functions for the corresponding failure modes.

In an embodiment, the error bit number (Eb), the read voltage shift (Vrb), the retry rate (Rr), the error bit number after R days (Eb'), the read voltage shift after R days (Vrb') and the retry rate after R days (Rr') are used as the input items, and the failure mode (Fn) is used as the output term. The failure mode prediction function is obtained according to a support vector machine, a decision tree, a neural network or any other appropriate algorithm. Moreover, the failure mode prediction function is stored in the function storage circuit 106.

After the failure mode prediction function is established, the state parameters (e.g., the error bit number (Eb), the read voltage shift (Vrb), the retry rate (Rr), the error bit number after R days (Eb'), the read voltage shift after R days (Vrb') and the retry rate after R days (Rr')) corresponding to the first block at different time points are inputted into the failure mode prediction function. Consequently, the failure mode of the first block can be predicted.

Moreover, the state parameters corresponding to the first failure mode (F1) in the information table are collected. That is, the error bit number (Eb), the read voltage shift (Vrb) and the retry rate (Rr) corresponding to the first failure mode (F1) are used as the input items, and the error bit number after R days (Eb'), the read voltage shift after R days (Vrb') and the retry rate after R days (Rr') are used as the output terms. Then, the state prediction function for the first failure mode (F1) is obtained according to a linear regression method and stored in the function storage circuit 106. The R days indicate any days. The magnitude of R may be varied according to the practical conditions of the solid state storage device 10. For example, if the use time of the solid state storage device 10 is not long, the set value of R is large because the possibility of causing the read failure problem of the non-volatile memory 105 is low. If the use time of the solid state storage device 10 has been very long, the set value of R is small. For example, the state prediction method is executed at the time interval of a half day or several hours in order to predict the state of the non-volatile memory 105. As the use time of the solid state storage device 10 is increased, the possibility of causing the read failure problem of the non-volatile memory 105 is increased. Since the frequency of performing the state prediction method is increased, the stored data is not erroneous.

Similarly, after the state parameters corresponding to the second failure mode (F2) in the information table are collected, the state prediction function for the second failure mode (F2) is obtained and stored in the function storage circuit 106. Similarly, after the state parameters corresponding to the other failure modes in the information table are collected, the state prediction function for the other failure modes are obtained and stored in the function storage circuit 106.

For example, if the first block is in the first failure mode, the state parameters of the first block are inputted into the state prediction function for the first failure mode. Consequently, the prediction result after R days is obtained. Similarly, if the second block is in the second failure mode, the state parameters of the second block are inputted into the state prediction function for the second failure mode. Consequently, the prediction result after R days is obtained. The rest may be deduced by analogy. The prediction result after R days denotes the state parameters after R days.

If the failure mode of the non-volatile memory 105 is changed, the previous prediction result is not accurate. In an embodiment, if the control circuit 101 judges that the failure mode of the non-volatile memory 105 is changed, the control circuit 101 predicts the state of the non-volatile memory 105 according to the state prediction function for the changed failure mode. Consequently, the updated prediction result of the non-volatile memory 105 is obtained.

Figure 5:
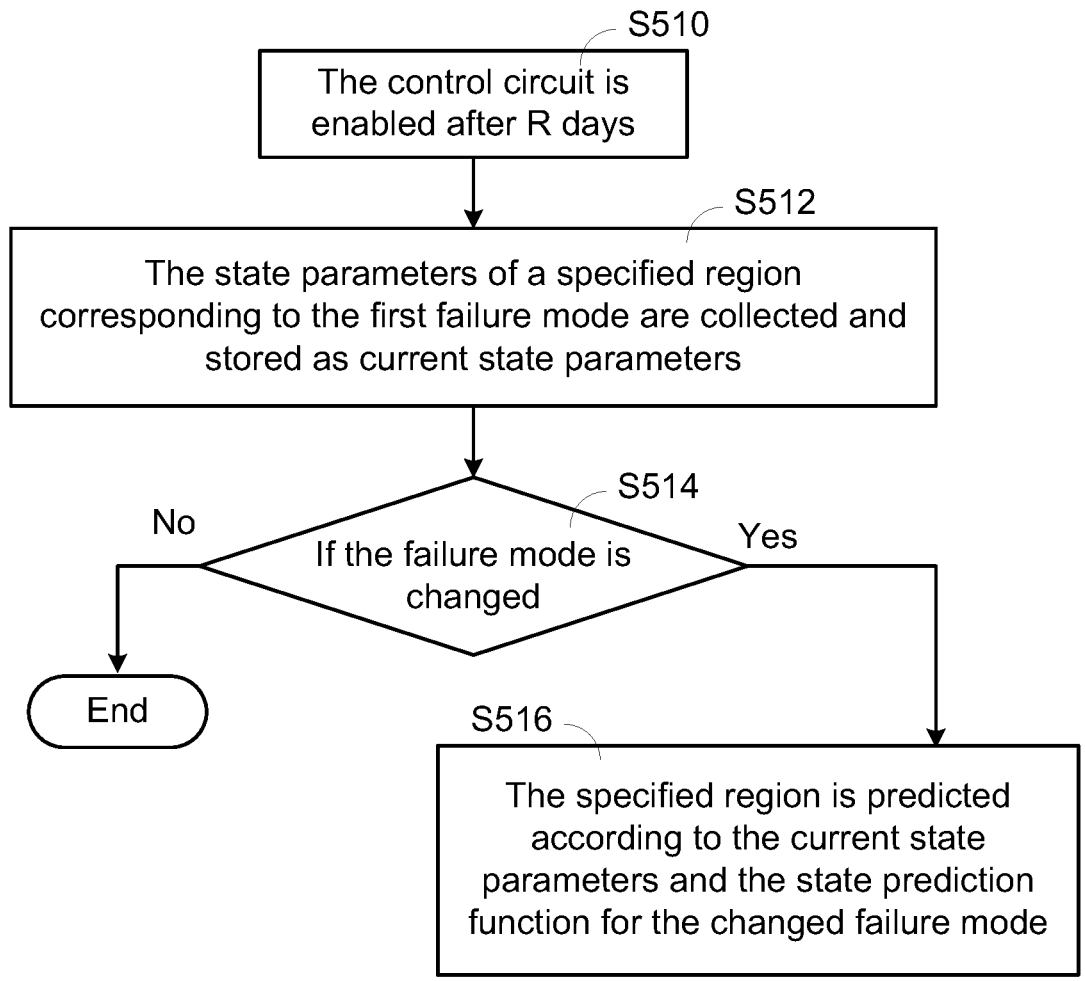
FIG. 5 is a flowchart illustrating a state prediction method according to an embodiment of the present invention.

FIG. 5 is a flowchart illustrating a state prediction method according to an embodiment of the present invention.

Firstly, the control circuit 101 of the solid state storage device 10 is enabled to predict the state of the non-volatile memory 105 at a time interval of R days (Step S510). The R days indicate any days. The magnitude of R may be varied according to the practical conditions of the solid state storage device 10. For example, if the use time of the solid state storage device 10 is not long, the set value of R is large because the possibility of causing the read failure problem of the non-volatile memory 105 is low. If the use time of the solid state storage device 10 has been very long, the set value of R is small. For example, the state prediction method is executed at the time interval of a half day or several hours in order to predict the state of the non-volatile memory 105. As the use time of the solid state storage device 10 is increased, the possibility of causing the read failure problem of the non-volatile memory 105 is increased. Since the frequency of performing the state prediction method is increased, the stored data is not erroneous.

For example, the solid state storage device 10 has been in the first failure mode according to the previous prediction results. Then, the state parameters of a specified region corresponding to the first failure mode are collected and stored as current state parameters by the control circuit 101 (Step S512). As mentioned above, the control circuit 101 is enabled to predict the state of the non-volatile memory 105 at a time interval of R days. Consequently, the state parameters stored before R days become the previous state parameters. Whenever the state of the non-volatile memory 105 is predicted, the corresponding state parameters are stored in the non-volatile memory 105 as the historical state parameters of the solid state storage device 10.

In an embodiment, the control circuit 101 selects a specified block of the non-volatile memory 105 and collects the error bit number (Eb), the read voltage shift (Vrb) and the retry rate (Rr) of the specified block as the current state parameters. The block that has the higher possibility of causing the read failure problem has the higher priority to be selected as the specified block. In some other embodiments, the control circuit 101 selects the state parameters of a page or plural blocks of the non-volatile memory 105 as the current state parameters. The first failure mode is a cycling mode, a high/room temperature baking mode, a read disturb mode, a cross-temperature read/write mode, a program disturb mode, a data retention mode, and the like.

Then, the control circuit 101 judges whether the failure mode is changed (Step S514). In an embodiment, the control circuit 101 judges whether the failure mode of the specified region is changed according to the previous state parameters (i.e., the state parameters stored before R days) and the current state parameters of the specified region.

If the failure mode is not changed in the step S514, the flowchart is ended. If the failure mode is changed in the step S514, the control circuit 101 predicts the specified region according to the current state parameters and the state prediction function for the changed failure mode (Step S516).

In the step S514, one of the following two approaches is used to judge whether the failure mode is changed.

The first approach of judging whether the failure mode is changed will be described as follows. As mentioned above, the failure mode prediction function has been stored in the function storage circuit 106. Consequently, after the previous state parameters (i.e., the state parameters stored before R days) and the current state parameters are inputted into the failure mode prediction function, the control circuit 101 predicts the failure mode of the specified region. If the failure mode prediction function outputs the first failure mode, it means that the failure mode is not changed. Whereas, if the failure mode prediction function outputs another failure mode, it means that the failure mode is changed.

The second approach of judging whether the failure mode is changed will be described as follows. In case that the failure mode prediction function is not stored in the function storage circuit 106, the control circuit 101 recognizes the failure mode of the specified region according to the state prediction functions for all failure modes. For example, four state prediction functions are stored in the function storage circuit 106. These four state prediction functions include the state prediction function for the first failure mode (F1), the state prediction function for the second failure mode (F2), the state prediction function for the third failure mode (F3) and the state prediction function for the fourth failure mode (F4).

After the previous state parameters (i.e., the state parameters stored before R days) are inputted into the state prediction function for the first failure mode (F1), the state prediction function for the second failure mode (F2), the state prediction function for the third failure mode (F3) and the state prediction function for the fourth failure mode (F4), the control circuit 101 generates four prediction results, respectively. Then, the failure mode of the specified region is determined according to one of the four prediction results which is the closest to the current state parameters.

For example, if the previous state parameters (i.e., the state parameters stored before R days) are inputted into the state prediction function for the first failure mode (F1), the state prediction function for the second failure mode (F2), the state prediction function for the third failure mode (F3) and the state prediction function for the fourth failure mode (F4), the control circuit 101 generates a first prediction result, a second prediction result, a third prediction result and a fourth prediction result, respectively.

If the control circuit 101 judges that the first prediction result is the closest to the current state parameters, the control circuit 101 confirms that the specified region is in the first failure mode. Meanwhile, the failure mode of the specified region is not changed. If the control circuit 101 judges that the second prediction result is the closest to the current state parameters, the control circuit 101 confirms that the specified region is in the second failure mode. Meanwhile, the failure mode of the specified region has been changed. Similarly, if the control circuit 101 judges that the third prediction result or the fourth prediction result is the closest to the current state parameters, the control circuit 101 confirms that the specified region is in the third failure mode or the fourth failure mode. Meanwhile, the failure mode of the specified region has been changed.

After the control circuit 101 confirms that the failure mode has been changed, the prediction result of the specified region is possibly inaccurate. Consequently, it is necessary to update the prediction result of the specified region.

If the control circuit 101 confirms that the failure mode is changed from the first failure mode (F1) to the second failure mode (F2), the control circuit 101 performs the step S516. That is, the current state parameters are inputted into the state prediction function for the second failure mode (F2). Then, the state prediction function for the second failure mode (F2) outputs the prediction result after R days, i.e., the status parameters of the specified region after R days. According to the updated prediction result, the control circuit performs a proper operation on the specified region.

As mentioned above, the control circuit 101 can predict the specified region. Moreover, the control circuit 101 can predict other regions of the non-volatile memory 105 according to the state prediction function for the second failure mode (F2) and update the prediction results of other regions. That is, after the collected current state parameters of an additional region are inputted into the state prediction function for the second failure mode (F2), the prediction result of the additional region is obtained.

From the above descriptions, the present invention provides a solid state storage device using a state prediction method. After the control circuit confirms that the failure mode of the non-volatile memory is changed, the control circuit predicts the non-volatile memory again according to the changed failure mode and updates the prediction result of the non-volatile memory. Moreover, the control circuit performs a proper operation on the non-volatile memory according to the updated prediction result. Consequently, the possibility of causing the read failure problem of the solid state storage device is reduced, and the read speed of the solid state storage device is increased.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A solid state storage device, comprising:
   a non-volatile memory comprising a specified region; and a control circuit connected with the non-volatile memory, and comprising a function storage circuit, wherein a state prediction function for a first failure mode and a state prediction function for a second failure mode are stored in the function storage circuit, wherein if the control circuit confirms that the specified region is changed from the first failure mode to the second failure mode, the control circuit predicts the specified region according to current state parameters of the specified region and the state prediction function for the second failure mode.

2. The solid state storage device as claimed in claim 1, wherein the specified region includes a block of the non-volatile memory, plural blocks of the non-volatile memory or a page of the non-volatile memory.

3. The solid state storage device as claimed in claim 1, wherein the control circuit judges whether the specified region is changed from the first failure mode to the second failure mode according to previous state parameters and the current state parameters of the specified region.

4. The solid state storage device as claimed in claim 3, wherein the function storage circuit further stores a failure mode prediction function, and the control circuit inputs the previous state parameters and the current state parameters into the failure mode prediction function, wherein if the failure mode prediction function outputs the second failure mode, the control circuit confirms that the specified region is changed from the first failure mode to the second failure mode.

5. A state prediction method for the solid state storage device according to claim 1, the state prediction method comprising steps:

collecting state parameters of the specified region and storing the state parameters of the specified region as the current state parameters at a specified time interval;

judging whether the specified region is changed from the first failure mode to the second failure mode; and if the specified region is changed from the first failure mode to the second failure mode, predicting the specified region according to the current state parameters of the specified region and the state prediction function for the second failure mode.

6. The state prediction method as claimed in claim 5, further comprising steps of:

inputting previous state parameters and the current state parameters into a failure mode prediction function; and if the failure mode prediction function outputs the second failure mode, confirming that the specified region is changed from the first failure mode to the second failure mode.

7. The state prediction method as claimed in claim 5, further comprising steps of:

collecting state parameters of an additional region as the current state parameters of the additional region; and inputting the current state parameters of the additional region into the state prediction function for the second failure mode so as to predict the additional region.

* * * * *